United States Patent [19]
Kang

[11] Patent Number: 5,253,208
[45] Date of Patent: Oct. 12, 1993

[54] IDENTIFICATION CIRCUIT FOR INDICATING REDUNDANT ROW OR COLUMN SUBSTITUTION

[75] Inventor: Young J. Kang, Seoul, Rep. of Korea

[73] Assignee: Hyundai Electronics Industries, Co., Ltd., Kyungki, Rep. of Korea

[21] Appl. No.: 866,513

[22] Filed: Apr. 10, 1992

[30] Foreign Application Priority Data

Apr. 12, 1991 [KR] Rep. of Korea .................. 91-5829

[51] Int. Cl.$^5$ ............................................. G11C 8/00
[52] U.S. Cl. ................................. 365/200; 365/201; 365/225.7; 371/10.3
[58] Field of Search ................ 365/200, 225.7, 230.08, 365/201; 371/10.3, 10.1

[56] References Cited

U.S. PATENT DOCUMENTS

| | | | |
|---|---|---|---|
| 4,389,715 | 6/1983 | Eaton et al. .......................... | 365/200 |
| 4,573,146 | 2/1986 | Graham et al. ...................... | 365/200 |
| 4,586,170 | 4/1986 | O'Toole et al. ...................... | 365/200 |
| 4,641,286 | 2/1987 | Shimotori et al. ............. | 365/225.7 X |
| 4,654,830 | 3/1987 | Chua et al. .......................... | 365/200 |
| 4,689,494 | 8/1987 | Chen et al. ...................... | 365/200 X |
| 4,985,866 | 1/1991 | Nakaizumi ........................... | 365/200 |

FOREIGN PATENT DOCUMENTS

0150298  1/1989  Japan ................................. 371/10.1

Primary Examiner—Eugene R. LaRoche
Assistant Examiner—Son Dinh
Attorney, Agent, or Firm—Stanley P. Fisher

[57] ABSTRACT

An identification circuit for identifying how many redundant rows and columns have been substituted for normal rows and columns in a memory device is disclosed. Column and row identifying circuits are used, respectively, with each circuit having a plurality of fuses with each fuse having a pair of leads and a plurality of resistive elements with each resistive element connected, in series, to a lead of one of the fuses and with the remaining lead of the fuse connected to a common lead. Each resistive element is connected to a ground to permit each interconnected fuse and resistive element to be connected in parallel. Thus, in use, each fuse intentionally opened in assembly of the memory device indicates that a malfunctioning single normal row/column has been substituted with a redundant row/column and upon sealing the memory device, substitution is indicated by application of a voltage to each circuit to form a current therein which is related to a number of substituted rows/columns present in the memory device.

10 Claims, 1 Drawing Sheet

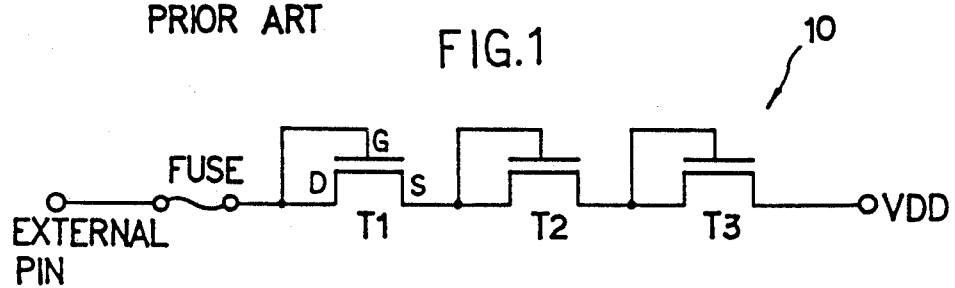
PRIOR ART FIG.1
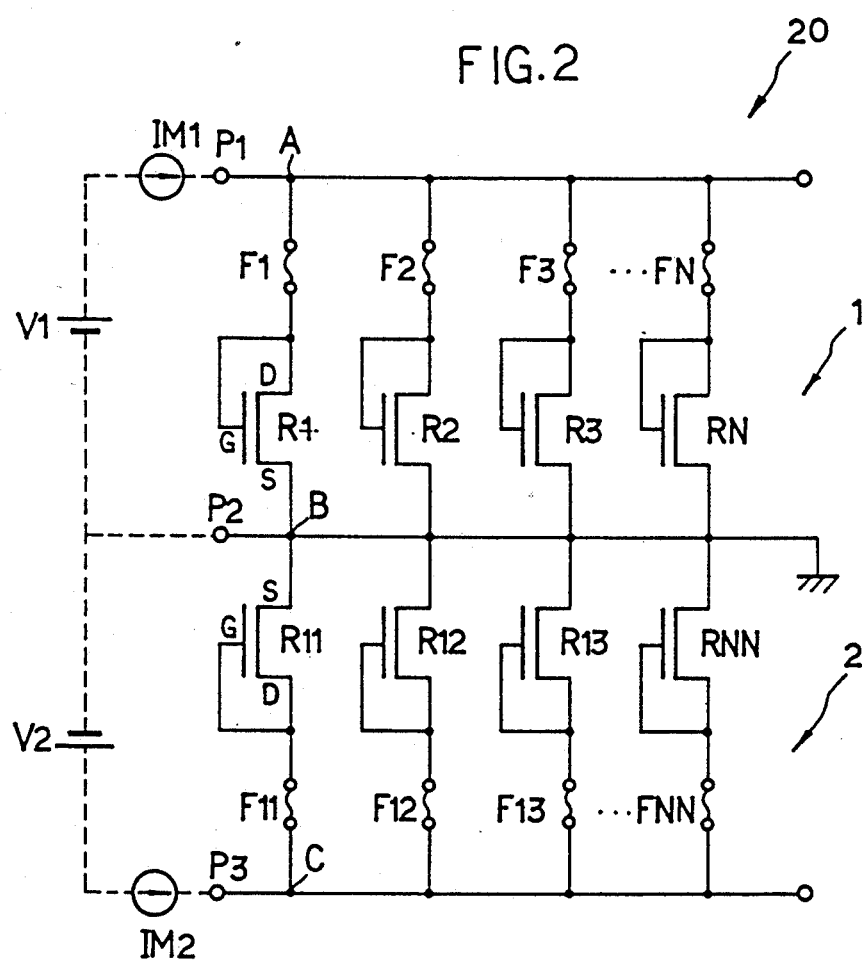
FIG.2

IDENTIFICATION CIRCUIT FOR INDICATING REDUNDANT ROW OR COLUMN SUBSTITUTION

BACKGROUND OF THE INVENTION

Field of the Invention

The invention relates to an identification circuit for indicating substitution of an original or normal row or column of cells for redundant ones, and more particularly, to an identification circuit for indicating the number of redundant rows or columns which have been substituted, where one or more of a plurality of normal cells arranged in a row or column on a single memory chip are determined to be defective and the memory chip is salvaged by substituting a redundant row or column for the defective normal row or column.

Information Disclosure Statement

Generally, VLSI (Very Large Scale Integration) techniques have brought about the construction of large arrays of binary storage cells on a single chip of silicon, and also have brought about high packing densities in memory devices. Upon increasing in packing density of the device, the susceptibility to manufacturing defects and error conditions to the unit cells increases, which results in a decrease in the manufacturing yield of the semiconductor devices. Therefore, in order to improve the manufacturing yield, redundant rows or columns of cells are separately constructed with and correspond to the normal rows or columns of cells on the single chip. The redundant rows or columns of cells can then be substituted for the defective normal rows or columns of cells.

It is assumed that a plurality of cells are arranged and electrically connected in row or column direction on the chip. For example, if a cell leak occurs at the fifth column, the entire normal fifth column is substituted with a redundant column comprised of redundant cells, and the normal column is disconnected from the circuit by using, for example, a laser beam. However, once the resulting chip is molded into a package, it cannot be identified as to whether there exists one of a row or column which was substituted for an normal row or column.

Therefore, the prior art identification circuit 10 which is formed on a single chip identifies redundant row or column substitution by using a plurality of active resistive elements (T1, T2 and T3) connected, in series, to a fuse, regardless of number of cells mounted thereon, as shown in FIG. 1. If there exists an normal column or row which was substituted by a redundant column or row, it can be determined whether an normal column or row was substituted by utilizing the identification circuit 10 of FIG. 1 which includes a cut or opened fuse connection which results in a voltage which is higher than the supply voltage VDD when tested at the external pin and the VDD terminal.

While redundant row or column substitution increases manufacturing yield, it results in a chip which does not include a means of determining its quality. Thus, the determination of whether redundant substitution has taken place and to what extent it has taken place is important in determining the quality of a particular semiconductor memory device.

However, from the prior art circuit the extent of redundant substitution cannot be determined, i.e. the number of the substituted column or row, rather only the fact that redundant substitution is present in a particular memory device.

Therefore, it is an object of the present invention to solve the problem set forth in the prior art and to provide an identification circuit for indicating substitution of a redundant row or column as to how many have been substituted in a particular packaged memory device.

The preceding objects should be construed as merely presenting a few of the more pertinent features and applications of the invention. Many other beneficial results can be obtained by applying the disclosed invention in a different manner or modifying the invention within the scope of the disclosure. Accordingly, other objects and a fuller understanding of the invention may be had by referring to both the summary of the invention and the detailed description, below, which describe the preferred embodiment in addition to the scope of the invention defined by the claims considered in conjunction with the accompanying drawings.

SUMMARY OF THE INVENTION

The identification circuit for indicating the presence of and the extent of substitution of redundant rows or columns for normal ones according to the present invention is defined by the claims with a specific embodiment shown in the attached drawings. For the purpose of summarizing the invention, the invention relates to an identification circuit for identifying how many redundant rows and columns have been substituted for normal rows and columns in a memory device having a plurality of normal rows and columns and a plurality of redundant rows and columns. The identification circuit comprises a column identifying circuit and a row identifying circuit.

The column identifying circuit comprises a plurality of fuses F1, F2, ... FN, with each fuse having a pair of leads. A plurality of resistive elements R1, R2, R3, ... RN is used with each resistive element operatively connected, in series, to a lead of one of the plurality of fuses and with the remaining lead of each the fuse connected to a first common lead. Each resistive element is connected to a ground to permit each interconnected fuse and resistive element to be connected in parallel in the column identifying circuit.

The row identifying circuit comprises a plurality of fuses F11, F12, ... FNN with each the fuse having a pair of leads. A plurality of resistive elements R11, R12, R13, ... RNN is used with each resistive element operatively connected, in series, to a lead of one of the plurality of fuses and with the remaining lead of each the fuse connected to a second common lead. Each resistive element is connected to a ground to permit each the interconnected fuse and resistive element to be connected in parallel in the row identifying circuit.

This indicates, in use, that for each single fuse intentionally opened in manufacture of the memory device, a malfunctioning single normal row and/or single normal column has been substituted with a redundant row and/or redundant column, respectively. Thus, upon sealing the memory device in a manner to protect the memory device and to provide external access to the first and the second common leads and to the ground, the substitution is indicated by the application of a voltage to the first common lead and to the ground of the column identifying circuit to form a current which is related to a number of substituted rows present in the memory device and by the application of a voltage to the second common lead and to the ground of the row identifying circuit to form a current which is related to a number of substituted columns present in the memory device thereby indicating the extent of redundant substitution in the memory device.

In the preferred embodiment of the present invention, each resistive element of the plurality of resistive elements R1, R2, R3, ... RN and of the plurality of resistive elements R11, R12, R13, ... RNN is a MOSFET having a gate and a drain electrode connected together and connected in series to one lead of the fuse and with the remaining source electrode of the MOSFET connected to the ground.

Thus, according to the preferred embodiment, the identification circuit for identifying how many redundant rows and columns have been substituted for normal rows and columns in a memory device having a plurality of normal rows and columns and a plurality of redundant rows and columns and comprisesa column identifying circuit and a row identifying circuit.

The column identifying circuit comprises a plurality of fuses F1, F2, ... FN, with each fuse having a pair of leads. A plurality of MOSFETs, is used with each MOSFET having a gate electrode and a drain electrode operatively connected to each other and, in series, to a lead of one of the plurality of fuses and with the remaining lead of the fuse connected to a first common lead. Each MOSFET has a source electrode connected to a ground to permit the interconnected fuse and MOSFET to be connected in parallel in the column identifying circuit.

The row identifying circuit comprises a plurality of fuses F11, F12, ... FNN with each the fuse having a pair of leads. A plurality of MOSFETs, with each MOSFET having a gate electrode and a drain electrode operatively connected to each other and operatively connected, in series, to a lead of one of the plurality of fuses and with the remaining lead of the fuse connected to a second common lead. Each MOSFET has a source electrode connected to a ground to permit the interconnected fuse and MOSFET to be connected in parallel in the row identifying circuit.

This permits, in use, for each single fuse intentionally opened in manufacture of the memory device to indicate that a malfunctioning single normal row and/or single normal column has been substituted with a redundant row and/or redundant column, respectively, and upon sealing the memory device in a manner to protect the memory device and to provide external access to the first and the second common leads and to the ground, the substitution is indicated by the application of a voltage to the first common lead and to the ground of the column identifying circuit to form a current which is related to a number of substituted columns present in the memory device and by the application of a voltage to the second common lead and to the ground of the row identifying circuit to form a current which is related to a number of substituted rows present in the memory device thereby indicating the extent of redundant substitution in the memory device.

In the preferred embodiment of the present invention the external access to the first and second common leads and to the ground is provided by external pins.

A further embodiment of the present invention includes a semiconductor memory device which includes the identification circuit of according to the present invention.

The more pertinent and important features of the present invention have been outlined above in order that the detailed description of the invention which follows will be better understood and that the present contribution to the art can be fully appreciated. Additional features of the invention described hereinafter form the subject of the claims of the invention. Those skilled in the art can appreciate that the conception and the specific embodiment disclosed herein may be readily utilized as a basis for modifying or designing other structures for carrying out the same purposes of the present invention. Further, those skilled in the art can realize that such equivalent constructions do not depart from the spirit and scope of the invention as set forth in the claims.

BRIEF DESCRIPTION OF THE DRAWINGS

For fuller understanding of the nature and objects of the invention, reference should be had to the following detailed description taken in conjunction with the accompanying drawings in which:

FIG. 1 illustrates an identification circuit for substitution of redundant row or column according to the prior art; and, FIG. 2 illustrates an identification circuit for indicating the extent of substitution of redundant row or column for normal ones according to the present invention.

Similar reference characters refer to similar parts throughout the several views of the drawings.

DETAILED DESCRIPTION OF THE INVENTION

FIG. 1 illustrates an identification circuit 10 for indicating substitution of a redundant row or column according to the prior art as described above. Hence, a description hereat is not considered necessary.

FIG. 2 shows an identification circuit 20 of the present invention. The circuit 20 indicates the number of redundant rows or columns which have been substituted for the normal rows or columns.

Referring to the drawing, a column identifying circuit 1 in which a plurality of fuses F1, F2, ... FN are formed with a polysilicon layer is provided. A single fuse is opened or cut to indicate that an normal column malfunctioned and has been substituted by a redundant column.

A plurality of active resistive elements R1, R2, ... RN which consist of a plurality of MOSFETs having a gate electrode and drain electrode connected to each other and then connected, in series, to one of the leads of one of a fuse of a plurality of the fuses F1, F2, ... FN,respectively. Each fuse and resistive element, F1 and R1, F2 and R2, ... FN and RN is connected in series relative to each other are then connected in parallel to a first common lead, i.e. connection A, and to a connection B, respectively, as shown in the drawing. Thus, current can be measured external the completed memory device by utilizing a current meter IM1 and by applying voltage V1 across the connections A and B.

A row identifying circuit 2 with a plurality of fuses F11, F12, FNN and a plurality of active resistive elements R1, R2, ... RN are arranged in the same manner as in the column identifying circuit 1. The plurality of the fuses F11, F12, ... FNN are also formed with a polysilicon layer. A single fuse is opened or cut to indicate that an normal row malfunctioned and has been substituted by a redundant row.

The column identifying circuit 1 and row identifying circuit 2 are positioned on the chip with the normal and redundant columns and rows but separately from these. Thus, for the column identifying circuit 1, connections A and B are electrically accessible from the completed device via external pins P1 and P2. For the row identifying circuit 2, connections B and C are electrically accessible from the completed device via external pins P2 and P3. Thus, the current readings of circuits 1 and 2 are able to be read after the memory device has been molded into the completed package ready for use.

It is noted that the external pin P2, which electrically accesses connection B, is common to both the column and the row identifying circuits 1 and 2, as illustrated at FIG. 2. Common connection B is also connected to the ground which is compatible with the ground of the memory cells in the packaged memory device.

By applying a predetermined voltage, V1 and V2, to the external pins P1 and P2, and to the external pins P2 and P3, i.e. to the column and the row identifying circuits 1 and 2, respectively, the current flowing through each respective current meter IM1 and IM2 connected, in series, to the voltage V1 and V2 can be measured.

As a result of the circuit described above, the total resistance in each respective circuit 1 and 2 will vary depending upon whether any of the redundant columns or rows were substituted. Thus, where one or two columns or rows have been substituted, the number of the fuses which are opened or cut off directly varies in agreement with the number substituted, which directly varies the resistance in each respective circuit.

Therefore, if a predetermined voltage V1 is applied to the external pins P1 and P2, and the voltage V2 is applied to the external pins P2 and P2, respectively, the current value measured by the current meter IM1 and IM2 will vary in agreement to the number of open fuses in each of the circuits 1 and 2. As a result, the resulting current is determined by the number of the fuses which have been cut off or opened in each circuit 1 or 2, respectively, from which, when compared with the current for a device having the same circuit 1 or 2 without any fuses being open or cut off, the extent of substitution can be determined.

As fully described above, according to the present invention, it can be seen the present identification circuit allows the identification of which how many redundant row or column have been substituted for the normal row or column within the package memory device by utilizing a simple testing performance, so that it can be improved the fabrication yield as well as lower production costs.

Although this invention has been described in its preferred form with a certain degree of particularity, it is appreciated by those skilled in the art that the present disclosure of the preferred form has been made only by way of example and that numerous changes in the details of the construction, combination and arrangement of parts may be resorted to without departing from the spirit and scope of the invention.

What is claimed is:

1. An identification circuit for redundant row or column for identifying the number of redundant row or column which has been substituted for an normal row or column of cells on a single chip within a packaged memory device, wherein the identification circuit comprises:

a column identifying circuit (1) for identifying the number of said redundant column which has been substituted, said column identifying circuit (1) further comprising a fuse (F1) and an active resistive element (R1) connected, in series, to said fuse (F1), with said fuse (F1) having a connection A, and said active resistive element having a common connection B column identifying circuit (1) further including a plurality of fuses (F2, F3, ... FN) and a plurality of active resistive elements (R2, R3, ... RN) connected, in series, to said plurality of fuses, respectively, with said each plurality of fuses and active resistive elements connected, in series, relative to each other being connected, in parallel, at across said connections (A) and (B), respectively;

a row identifying circuit (2) for identifying the number of said redundant row which has been substituted, said column identifying circuit (2) further comprising an active resistive element (R11) connected to said common connection (B)and a fuse (F11) connected, in series, to said active resistive element (R11) with said fuse (F11) having a connection (C), said identifying circuit (2) further including a plurality of active resistive elements (R12, R13, ... RN) and a plurality of fuses (F12, F13, ... FNN) connected, in series, to said plurality of active resistive elements, with said each plurality of active resistive elements and fuses connected, in series, relative to each other being connected, in parallel, at across said connection (B) and (C), respectively; and external pins (P1), (P2) and (P3) for applying a predetermined voltage thereto from the external, with said each external pin (P1), (P2) and (P3) being connected to said each connection (A), (B) and (C) so as to be withdrawn from the internal when the resulting memory device have been molded into the package, such that in use it is identified as to whether how many number of said redundant row or column have been substituted by applying the predetermined voltage both to said external pins (P1) and (P2) and to said external pins (P2) and (P3), measuring the current values flowing through said each column and row identifying circuit, and comparing said each measured current value with a predetermined reference current value.

2. The identification circuit of claim 1 wherein said plurality of fuses (F1, F2, ... FN) in said column identifying circuit and said plurality of fuses (F11, F12, ... FNN) in said row identifying circuit are polysilicon.

3. The identification circuit of claim 1 wherein said plurality of active resistive elements (R1, R2, ... RN) in said column identifying circuit (1) and said plurality of active resistive elements (R11, R12, ... RNN) in said row identifying circuit (2) are MOSFETs with the gate electrode of which being connected to the drain electrode thereof.

4. A semiconductor memory device including said identification circuit of claim 1.

5. An identification circuit for identifying how many redundant rows and columns have been substituted for normal rows and columns in a memory device having a plurality of normal rows and columns and a plurality of redundant rows and columns, said circuit comprising:

a column identifying circuit and a row identifying circuit, wherein said column identifying circuit comprises a plurality of fuses (F1, F2, ... FN), with each fuse having a pair of leads;

a plurality of resistive elements (R1, R2, R3, ... RN) with each resistive element operatively connected, in series, to a lead of one of said plurality of fuses (F1, F2, ... FN) and with the remaining lead of each said fuse connected to a first common lead; and each said resistive element connected to a ground to permit each said interconnected fuse and resistive element to be connected in parallel in said column identifying circuit;

and wherein said row identifying circuit comprises a plurality of fuses (F11, F12, ... FNN) with each said fuse having a pair of leads;

a plurality of resistive elements (R11, R12, R13, ... RNN) with each resistive element operatively connected, in series, to a lead of one of said plurality of fuses (F11, F12, ... FNN) and with the remaining lead of each said fuse connected to a second common lead (C); and each said resistive element connected to a ground to permit each said interconnected fuse and resistive element to be connected in parallel in said row identifying circuit, such that, in use, for each single fuse intentionally opened in manufacture of said memory device to indicate that a malfunctioning single normal row and/or single normal column has been substituted with a redundant row and/or redundant column, respectively, and upon sealing said memory device in a manner to protect said memory device and to provide external access to said first and said second common leads and to said ground, said substitution is indicated by the application of a voltage to said first common lead (A) and to said ground of said column identifying circuit to form a current which is related to a number of substituted column present in said memory device and by application of a voltage to said second common lead (C) and to said ground of said row identifying circuit to form a current which is related to a number of substituted rows present in said memory device thereby indicating the extent of redundant substitution in said memory device.

6. The identification circuit of claim 5 wherein each said resistive element of said plurality of resistive elements (R1, R2, R3, ... RN) and said plurality of resistive elements (R11, R12, R13, ... RNN) is a MOSFET having a gate and a drain electrode connected together and connected in series to said one lead of said fuse and having a source electrode connected to said ground.

7. The identification circuit of claim 5 wherein said external access to said first (A) and said second (C) common leads and to said ground (B) is provided by external pins, (P1), (P2) and (P3), respectively.

8. An identification circuit for identifying how many redundant rows and columns have been substituted for normal rows and columns in a memory device having a plurality of normal rows and columns, said circuit comprising:

a column identifying circuit and a row identifying circuit, wherein said column identifying circuit comprises a plurality of fuses (F1, F2, ... FN), with each fuse having a pair of leads;

a plurality of MOSFETs, with each MOSFET having a gate electrode and a drain electrode operatively connected to each other and, in series, to a lead of one of said plurality of fuses and with the remaining lead of each said fuse connected to a first common lead (A); and each said MOSFET having a source electrode connected to a ground to permit each said interconnected fuse and MOSFET to be connected in parallel in said column identifying circuit;

and wherein said row identifying circuit comprises a plurality of fuses (F11, F12, ... FNN) with each said fuse having a pair of leads;

a plurality of MOSFETs, with each MOSFET having a gate electrode and a drain electrode operatively connected to each other and operatively connected, in series, to a lead of one of said plurality of fuses and with the remaining lead of each said fuse connected to a second common lead (C);

each said MOSFET having a source electrode connected to a ground to permit each said interconnected fuse and MOSFET to be connected in parallel in said row identifying circuit, such that, in use, for each single fuse intentionally opened manufacture of said memory device to indicate that a malfunctioning single normal row and/or single normal column has been substituted with a redundant row and/or redundant column, respectively, and upon sealing said memory device in a manner to protect said memory device and to provide external access to said first and said second common leads and to said ground, said substitution is indicated by the application of a voltage to said first common lead and to said ground of said column identifying circuit to form a current which is related to a number of substituted columns present in said memory device and by application of a voltage to said second common lead and to said ground of said row identifying circuit to form a current which is related to a number of substituted rows present in said memory device thereby indicating the extent of redundant substitution in said memory device.

9. The identification circuit of claim 8 wherein said external access to said first and said second common leads and to said ground is provided by external pins.

10. A semiconductor memory device including said identification circuit of claim 8.

* * * * *